United States Patent [19]

Müller et al.

[11] 4,291,411

[45] Sep. 22, 1981

[54] REMOTE CONTROL FOR RADIOTELEPHONES

[75] Inventors: Horst Müller; Helmut Vorwerk, both of Berlin, Fed. Rep. of Germany

[73] Assignee: Robert Bosch GmbH, Stuttgart, Fed. Rep. of Germany

[21] Appl. No.: 35,466

[22] Filed: May 3, 1979

[30] Foreign Application Priority Data

May 3, 1978 [DE] Fed. Rep. of Germany ....... 2819386

[51] Int. Cl.³ .................... H04B 1/40; H04B 9/00; H04B 11/00
[52] U.S. Cl. .................... 455/88; 455/151; 455/352; 455/603; 340/694
[58] Field of Search ................ 179/2 A, 2 E; 455/15, 455/68, 77, 88, 151, 352, 353, 603, 607, 606; 340/694

[56] References Cited

U.S. PATENT DOCUMENTS

| | | | |
|---|---|---|---|
| 3,699,443 | 10/1972 | Weger | 325/64 |
| 3,745,462 | 7/1973 | Trimble | 325/64 |
| 3,906,366 | 9/1975 | Minami et al. | 325/37 |
| 4,032,844 | 6/1977 | Imazeki | 325/25 |
| 4,081,747 | 3/1978 | Meyerle | 325/37 |
| 4,107,611 | 8/1978 | Holcomb et al. | 325/64 |
| 4,147,984 | 4/1979 | Caudel et al. | 455/77 |
| 4,153,877 | 5/1979 | Fathauer et al. | 325/25 |

*Primary Examiner*—Jin F. Ng
*Attorney, Agent, or Firm*—Spencer & Kaye

[57] ABSTRACT

A radiotelephone system having a control transmitter unit which includes a control unit having operating keys, a channel indicator device, a function indicator device and a loudspeaker/microphone device, the control transmitter unit including an ultrasonic or infrared transmitter for the transmission of the function signals required for operation of the radiotelephone system, the radiotelephone system further having a receiver unit provided with an ultrasonic or infrared receiver for actuating function and indicator devices.

11 Claims, 3 Drawing Figures

( ) = ADDITIONAL FOR WIRELESS TRANSMISSION

# REMOTE CONTROL FOR RADIOTELEPHONES

BACKGROUND OF THE INVENTION

The present invention relates to a radiotelephone system of the type having a main transmitting/receiving device and a control transmitter unit remote from the device and provided with operating keys, a channel indicator device, a function indicator device and a loudspeaker-microphone device.

Apparatus of this type having a control transmitter unit which includes a remote control is already known in the art, as described, for example in Service Instructions KF 80/160/450, published by ROBERT BOSH GmbH in 1968, in which the connection with the radiotelephone, usually disposed in the trunk of an automobile, is established via a long, multiconductor cable which is difficult, and therefore expensive, to install.

Additionally, ultrasonic or infrared remote control transmitters are known for controlling electronic entertainment instruments, such as radios, TV's, etc., but only for conducting information in the direction from the remote control transmitter to the instrument, without it being possible for the transmitter to receive return information from the instrument.

SUMMARY OF THE INVENTION

It is an object of the present invention to provide an improved arrangement for controlling the operation of such a system.

This and other objects are achieved, in a radiotelephone system of the above-described type, by providing the control transmitter unit with an ultrasonic or infrared signal transmitter containing a remote control circuit for transmitting the function signals required to operate the radiotelephone system, and by further providing the system with a receiver unit containing an ultrasonic or infrared receiver responsive to signals from the transmitter for controlling the operation of the main device.

The remote control according to the present invention has the advantage that, instead of the multiconductor cable, having approximately 26 conductors, previously required for connection with the radiotelephone, only one two-conductor or four-conductor cable is required, together with a voltage source in the transmitter if a two-conductor cable is used.

Preferred embodiments of the remote control according to the invention operate completely without wires so that no cable is needed between the radiotelephone and the transmitter, which is particularly advantageous.

According to particularly advantageous embodiments of the invention, use is made of a single-wire line between the radiotelephone and the transmitter to assure reliable radio communications.

DESCRIPTION OF THE PREFERRED EMBODIMENTS

Figure 1:
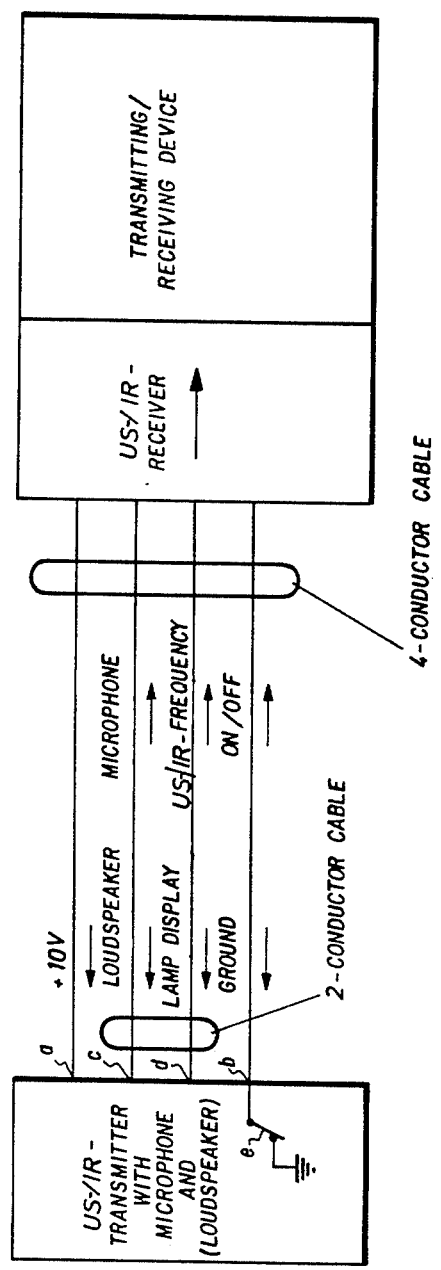
FIG. 1 is a block circuit diagram showing a connecting cable between the control transmitter unit and the receiver unit of a radiotelephone according to a preferred embodiment of the invention.

FIG. 1 shows a multi-conductor connecting cable between a control unit according to the invention and the receiver unit of a radiotelephone. The connecting cable has four conductors, or lines a, b, c and d, from which the lines a and b lead the supply voltage from the radiotelephone to the control unit. The line b is grounded by way of a switch e of the control unit. Line c transduces in connection with line b audio signals by means of ultrasonic or infrared frequencies in both directions (see arrows). If the transmitter unit has its own power source only two lines c and d are necessary. It is possible, too to use only one line, line d, if only ultrasonic or infrared frequencies have to be transduced and if microphone and loudspeaker are connected directly with the radiotelephone which in this case is preferable built in the panel of a car. Line b is superfluous because the control unit has its own power source.

Figure 2:
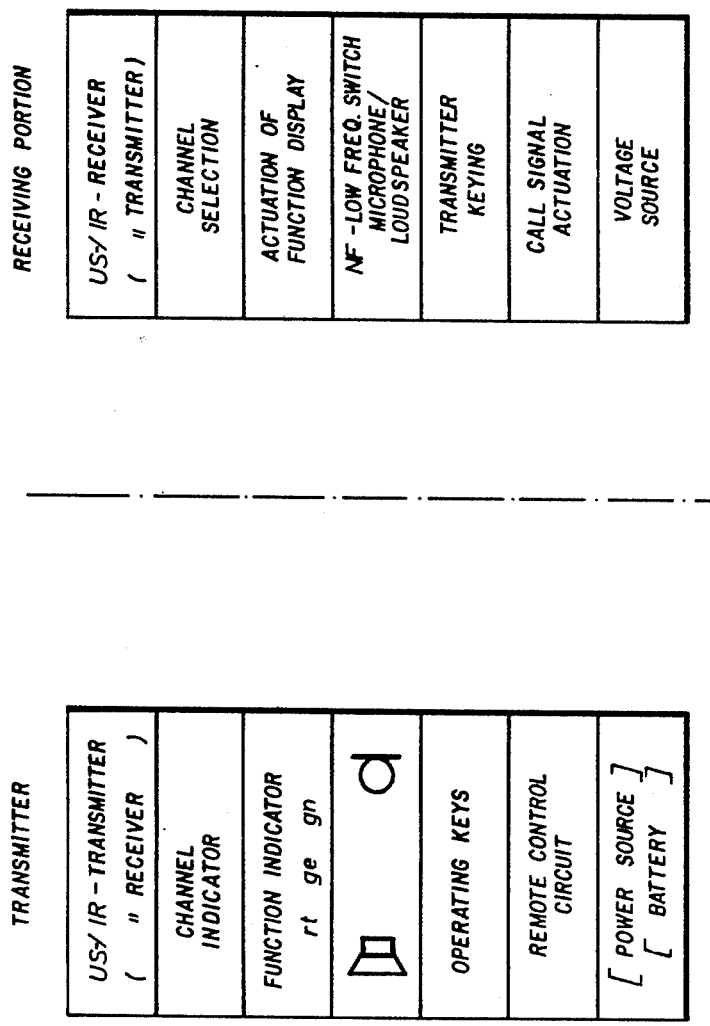
FIG. 2 is a block diagram of the components of the transmitter and the receiver, including the respective function and indicator devices, of the system of FIG. 1.

FIG. 2 illustrates the components of a transmitter unit and of a receiver unit according to the invention, with the function and indicator devices disposed in the respective units. The transmitter unit essentially includes an ultrasonic or infrared transmitter containing a remote control circuit, for example of the integrated circuit type SAA 1024 or 1050. The transmitter unit further includes a channel indicator which displays the selected channel by means of an illuminated display, and a function indicator which indicates whether another user is using the selected channel, or whether the transmitter is in operation or whether the respective user is being called. Additionally, there is provided a loudspeaker-microphone unit for the exchange of conversation. The transmitter unit is further provided with keys arranged to actuate the individual function signals. Moreover, the transmitter unit may have its own power source if transmission between the transmitter unit and the receiver unit is to be effected over a two-line cable.

For wireless transmission between the transmitter and receiver units it is necessary, in addition, to provide an ultrasonic or infrared receiver, for example an integrated circuit of the type SAA 1025 or 1051, in the transmitter unit.

The receiver unit essentially includes an ultrasonic or infrared receiver, for example an integrated circuit of the type SAA 1025 or 1051, and circuitry for channel selection, actuation of the function indicator, switching the microphone and the loudspeaker to low frequency operation, keying the transmitter, actuating the audio call signal and the noise barrier. The power source of the receiver unit is the power supply of the radiotelephone system.

Figure 3:
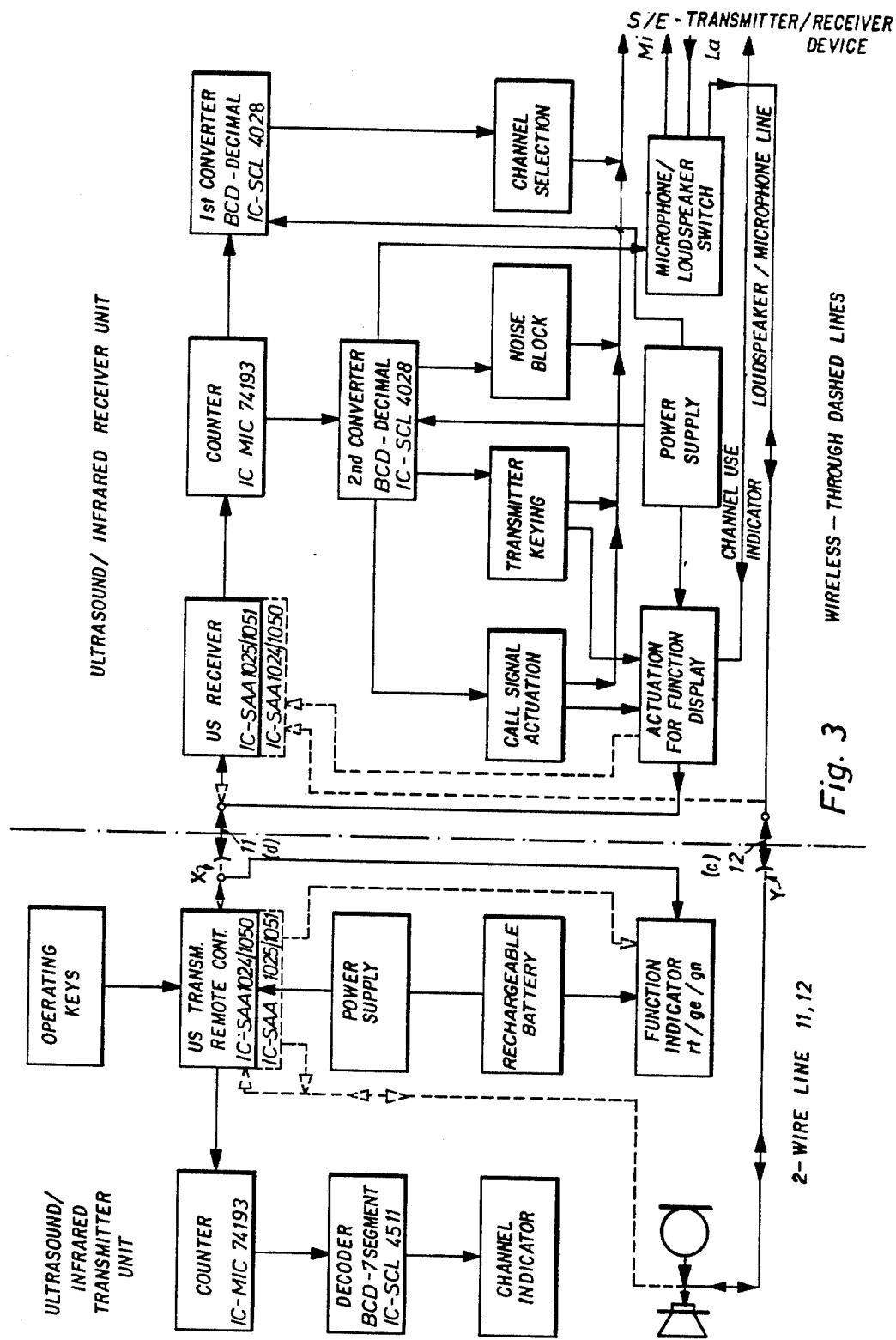
FIG. 3 is a block circuit diagram in flow chart form of a preferred embodiment of the transmitter and the receiver according to the invention.

FIG. 3 is a block circuit diagram, showing signal flow, for such transmitter and receiver units connected together via a two-line cable or in wireless communication. In the operating mode, keys in the ultrasonic or infrared transmitter unit are used to select the operating functions so that an ultrasonic or infrared transmitter, for example an IC-SAA 1024 or 1050, powered by its own power supply in the transmitter unit, begins operation and transmits the coded operating function information in the form of ultrasonic or infrared signals through a suitable line 11. A function indicator device connected to the power supply is likewise connected to line 11. A further line is connected from the operating keys, via the ultrasonic or infrared transmitter directly to a counter, for example an IC-MIC 74193, which stores a representation of the selected channel and actuates a display in a channel indicator via a decoder, for example a binary coded decimal 7-segment decoder of the type IC-SCL 4511.

In the ultrasonic or infrared receiver unit, an ultrasonic or infrared receiver, for example an IC-SAA 1025 or 1051, receives the ultrasonic or infrared signals transmitted through line 11, and those signals are converted to BCD form and fed to a counter, for example an IC-MIC 74193. The counter stores a representation of the signals furnished for channel selection and the stored signals travel, via a first converter, for example a BCD-decimal converter of the type IC-SCL 4028, to a channel selection device. Moreover, the counter furnishes signals intended for other functions via a second converter, of the same type as the first converter, to a call signal actuation device, a transmitter keying device, and a noise blocking device, which are all connected to the transmitter/receiver of the radiotelephone system via a common line which is also connected with the channel selection device. The second converter is likewise connected to a microphone/loudspeaker switch device.

One line from the call signal actuation device and one line from the transmitter keying device are connected to a function indicator actuating device which is also connected to a line in the transmitter/receiver of the radiotelephone system for conducting channel use indicator signals. The output of the function indicator actuating device is connected to line 11. The converters and the other active electronic components, for example the device for actuating the function display, are connected to the power supply of the radiotelephone system so as to receive operating power therefrom. Low frequency speech signals are transmitted through a loudspeaker-microphone line 12 between the microphone/loudspeaker switch device and the ultrasonic or infrared transmitter unit. To connect the two units, lines 11 and 12 can be connected by plug-in connectors X and Y.

For wireless operation, lines 11 and 12 are eliminated and transmitting/receiving antennas take over the functions of transmitting the ultrasonic or infrared signals between the ultrasonic or infrared transmitter and the ultrasonic or infrared receiver unit. It is then further necessary to provide for this wireless radio operation an ultrasonic or infrared receiver, for example of the type IC-SAA 1025/1051, in the ultrasonic or infrared transmitter unit and an ultrasonic or infrared transmitter, for example of the type IC-SAA 1024/1050 in the ultrasonic or infrared receiver unit. The signal paths existing in the case of wireless operation are represented by dashed lines.

Presumably the radiotelephone device is in the trunk of a car, it is necessary to place the ultrasonic or infrared transmitter and receiver in the back range of the interior of the car and to connect this transmitter and receiver by means of additional lines with the trunk-mounted radiotelephone.

Circuits for ultrasonic or infrared receivers and transmitters are well known in the art, especially for remote-controlled tv sets. Examples for ultrasonic transmitter and receiver circuits are shown in Blaupunkt Service manual for control unit, No. BP/KDB 675.02.002.20. In the same Service manual you will find an embodiment of a channel-selector-circuit.

It will be understood that the above description of the present invention is susceptible to various modifications, changes and adaptations, and the same are intended to be comprehended within the meaning and range of equivalents of the appended claims.

What is claimed is:

1. In a radiotelephone system having a radio frequency transmitting/receiving device, a low frequency and control signal transmitting/receiving unit remote from the device, and means connected between the device and the unit for conducting therebetween system operation function control signals, constituted by a form of energy selected from among ultrasonic energy and infrared energy, the improvement wherein said means comprise: a first transmitter and receiver connected in said unit for transmitting and receiving said signals constituted by said selected form of energy; a second transmitter and receiver connected to said device for transmitting and receiving said signals constituted by said selected form of energy; each transmitter and receiver including means for coupling said first and second transmitter and receivers together to permit conduction therebetween of said signals constituted by said selected form of energy over a signal conducting path constituted by a selected one of an air path and a cable containing a maximum of four conductors; said unit comprises a function indicator and said device further comprises a channel selector, a call signal actuator, a transmitter keying device, a microphone/loudspeaker switch, a noise barrier, and a function display actuator, connected to be controlled by signals from said second transmitter and receiver and connected to control the operation of said device and of said function indicator.

2. An arrangement as defined in claim 1 wherein the signal conducting path is constituted by a four-conductor cable.

3. An arrangement as defined in claim 1 wherein the signal conducting path is constituted by a two-conductor cable.

4. An arrangement as defined in claim 1, 2 or 3 wherein said unit is constituted by a plug-in structure.

5. An arrangement as defined in claim 1, 2 or 3 wherein said unit further comprises a loudspeaker-microphone device and an amplifier connected to amplify the audio frequency signals to and from said loudspeaker-microphone device.

6. An arrangement as defined in claim 1, 2 or 3 usable in a motor vehicle, wherein said unit further comprises a rechargeable battery serving as a power source and arranged to be recharged by the electrical system of the motor vehicle.

7. In a radiotelephone system having a main transmitting/receiving device and a control unit remote from said device and provided with operating keys, a channel indicator device, a function indicator device and a loudspeaker-microphone device, the improvement wherein said control unit comprises a power supply and a signal transmitter/receiver containing a remote control circuit for transmitting, in a form of energy selected from amount ultrasonic energy and infrared energy, the function signals required to operate said radiotelephone system and outgoing audio frequency speech signals and for receiving energy in the selected form constituting actuating signals for said function indicator device and incoming audio frequency speech signals and said system further comprises a receiver unit at the same location as said main device and containing function and display actuation devices, and a receiver/transmitter for receiving said signals transmitted from said control unit and transmitting said actuating signals for said function indicator device and said incoming sppech signals to said control unit.

8. An arrangement as defined in claim 7 wherein said receiver unit further comprises a channel selector, a call signal actuator, a transmitter keying device, a microphone/loudspeaker switch, a noise barrier, and a function display actuator, connected to be controlled by signals from said receiver/transmitter in said receiver unit and connected to control the operation of said main device and of said function indicator device.

9. An arrangement as defined in claim 7 wherein said control unit is constituted by a plug-in structure.

10. An arrangement as defined in claim 7 wherein said control unit further comprises an amplifier connected to amplify the speech signals to and from said loudspeaker-microphone device.

11. An arrangement as defined in claim 7 usable in a motor vehicle, wherein said power supply is a rechargeable battery arranged to be recharged by the electrical system of the motor vehicle.

* * * * *